United States Patent [19]

Abe et al.

[11] 4,438,368
[45] Mar. 20, 1984

[54] PLASMA TREATING APPARATUS

[75] Inventors: Haruhiko Abe; Hiroshi Harada; Masahiko Denda; Koichi Nagasawa; Yoshio Kono, all of Itami, Japan

[73] Assignee: Mitsubishi Denki Kabushiki Kaisha, Tokyo, Japan

[21] Appl. No.: 315,730

[22] Filed: Oct. 28, 1981

[30] Foreign Application Priority Data

Nov. 5, 1980 [JP] Japan ................... 55-156086

[51] Int. Cl.$^3$ .................... H01J 7/46; H01J 19/80
[52] U.S. Cl. ................... 315/39; 219/121 PL; 427/34; 313/231.01; 315/111.61; 315/111.41
[58] Field of Search ............ 315/39, 111.6, 111.7, 315/111.8, 39, 111.61, 111.71, 111.81, 111.41; 313/231.31, 231.41; 219/121 PL; 427/34

[56] References Cited

U.S. PATENT DOCUMENTS

| | | | |
|---|---|---|---|
| 2,817,045 | 12/1957 | Goldstein et al. | 315/39 |
| 2,837,693 | 6/1958 | Norton | 315/39 |
| 3,280,364 | 10/1966 | Sugawara et al. | 315/39 X |
| 3,313,979 | 4/1967 | Landauer | 315/39 |
| 3,541,372 | 11/1970 | Omura et al. | 315/39 |
| 3,872,349 | 3/1975 | Spero et al. | 315/39 |
| 3,906,892 | 9/1975 | Van Cakenberghe | 313/231.31 |
| 3,911,318 | 10/1975 | Spero et al. | 315/39 |

*Primary Examiner*—Saxfield Chatmon, Jr.
*Attorney, Agent, or Firm*—Oblon, Fisher, Spivak, McClelland & Maier

[57] ABSTRACT

A plasma treating apparatus includes: an air-core coil for generating a static magnetic field which is axially uniform and a high-frequency waveguide for generating a high-frequency electromagnetic field which is irregular in the axial direction of the air-core coil. A plasma generating glass tube is disposed in the high-frequency waveguide and adapted to be supplied with a gas and a plasma reaction bath held under a vacuum for receiving the plasma flow which is generated axially in the glass tube. A substrate platform is disposed in the reaction bath for supporting a substrate to be treated at a right angle with respect to the plasma flow. There is also included a magnetic field generating coil disposed outside of said reaction bath for shaping the plasma.

2 Claims, 4 Drawing Figures

F I G. 1
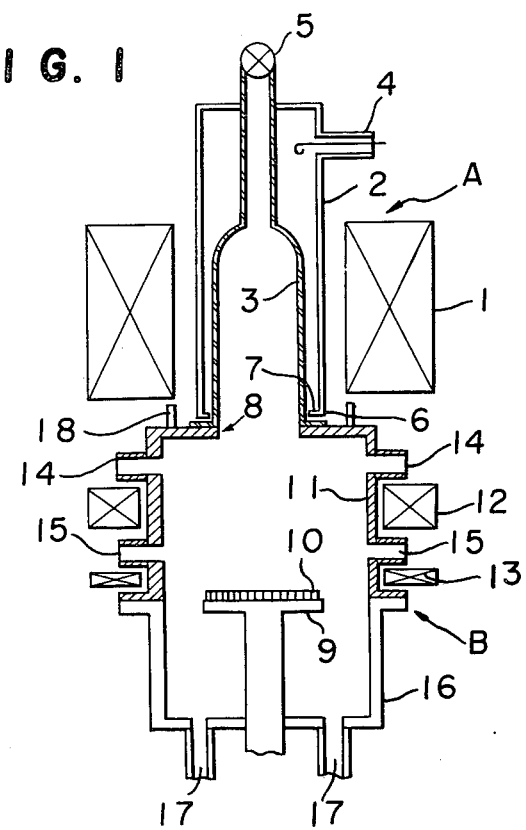
F I G. 2
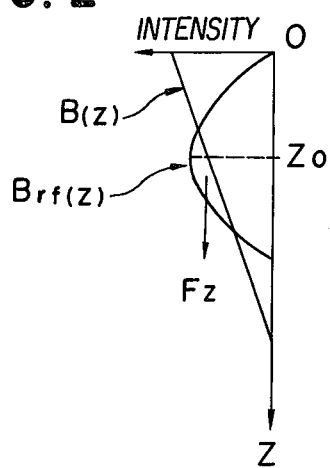

PLASMA TREATING APPARATUS

BACKGROUND OF THE INVENTION

The present invention relates to a plasma treating apparatus, and more particularly to a plasma treating apparatus making use of the local electron cyclotron resonance.

SUMMARY OF THE INVENTION

In accordance with the present invention, a plasma treating apparatus has an air-core coil for generating a static magnetic field which is axially uniform and a high-frequency waveguide for generating a high-frequency electromagnetic field which is irregular in the axial direction of the air-core coil, a plasma generating glass tube is disposed in the high-frequency waveguide and adapted to be supplied with a gas. A plasma reaction bath is held under a vacuum for receiving the plasma flow which is generated axially in the glass tube and is a substrate platform disposed in the reaction bath for supporting a substrate to be treated at a right angle with respect to the plasma flow. A magnetic field generating coil is disposed outside of the reaction bath for shaping the plasma.

BRIEF DESCRIPTION OF THE DRAWINGS

FIG. 1 is a schematic view showing the construction of the basic embodiment of the apparatus according to the present invention;

FIG. 2 is a diagram illustrating the operations of the same; and

DETAILED DESCRIPTION OF THE PREFERRED EMBODIMENTS

Figure 3:
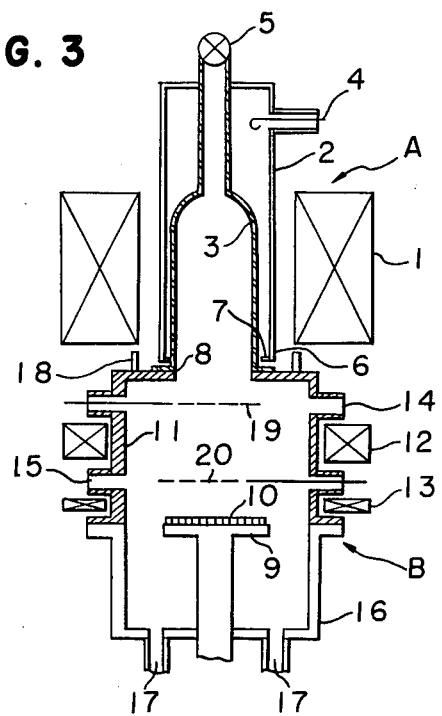
FIGS. 3 and 4 are schematic views showing the constructions of other embodiments of the present invention.

The present invention will now be described in detail in connection with the embodiments thereof with reference to FIGS. 1 to 4.

FIG. 1 shows one basic embodiment of the apparatus according to the present invention, which is generally constructed of a plasma generating section and a plasma reaction section.

The plasma generating section A is constructed to include an air-core coil 1 for generating a static magnetic field, which is uniform in the axial direction, a high-frequency waveguide 2 for generating a high-frequency electromagnetic field which is irregular in the axial direction, and a plasma generating glass tube 3. The supply of a high-frequency power to the high-frequency waveguide 2 is performed through a high-frequency supply coupling terminal 4, whereas the supply of the gas to the plasma generating glass tube 3 is performed through a gas supply valve 5.

The reason why a plasma flow is formed at the aforementioned plasma generating section A will be described in the following. Now, if the intensity of the static magnetic field which is irregular in the axial direction (which is indicated at Z) is denoted by $B(Z)$, the high-frequency waves to be supplied through the supply terminal 4 to the inside of the high-frequency waveguide 2 are reflected by a reflector 7, which is disposed at the open end 6 of the waveguide 2, thereby to establish a high-frequency electric field $Erf(Z)$ which is irregular along that waveguide 2. A typical example of that irregular high-frequency electric field $Erf(Z)$ is an existing wave which is schematically shown in FIG. 2.

Now, if the angular frequency of the high-frequency waves is denoted at $\omega$, the angular frequency of electrons in the static magnetic field B having an intensity can be expressed by the cyclotron angular frequency $\omega c = eB/mc$, as is well known in the art. Hence, if the cyclotron resonance condition of $\omega = \omega c$ holds, the energy of the high-frequency waves is continuously supplied to the electrons so that the energy of the electrons is augmented. Here, in case the static magnetic field $B(Z)$ shown in FIG. 2 is irregular and in case the high frequency of the waves is fixed, the cyclotron resonance condition of $\omega = \omega c$ is satisfied only at a place of $Z = Zo$, for example. In other words, the local electron cyclotron resonance condition holds. Moreover, this condition can be readily achieved, in case the high frequency of the waves is fixed, either by suitably adjusting the electric current to be supplied to the aforementioned air-core coil 1 of FIG. 1 or by suitably adjusting the arrangement of a plurality of air-core coils 1. On the contrary, in case the intensity $B(Z)$ of the static magnetic field is fixed, the electron cyclotron resonance condition of $\omega = \omega c$ can be achieved by adjusting the high-frequency of the waves.

Now, let the case be considered, in which the cyclotron resonance condition of $\omega = \omega c$ holds at $Z = Zo$ with the aforementioned arrangement of FIG. 1. If, under this condition, a gas under suitable pressure is introduced into the plasma generating glass tube 3, the electrons, which have been generated at the aforementioned preliminary discharge state, are brought to a higher energy state by the continuous energy supply from the high-frequency waves. The electrons at that high energy state collide to generate the plasma, into which the high-frequency power is injected under the resonance condition. Therefore, if the gas to be introduced into the plasma generating glass tube 3 is $CF_4$, for example, the ions $F^+$, $CF^+$, $CF_2^+$ and $CF_3^+$, and their respective kinds, concentrations and energies can be controlled together with the kinds, concentrations and energies of radicals such as $F^*$ or $CF_x^*$ by suitably adjusting the power of the high-frequency waves in addition to the pressure of the gas. Incidentally, the situation thus far described can be more or less achieved even under the condition inconsistent with not only the gas pressure but also the resonance condition $\omega = \omega c$, but the efficiency is not always excellent.

With the static magnetic field $B(Z)$ and the electric field $Erf(Z)$ being irregular, on the contrary, as shown in FIG. 2, an axial force Fz to be given by the following Equation is exerted upon the electrons so that the electrons are axially accelerated.

$$Fz = \frac{e^2}{4m\omega^2} \frac{\partial}{\partial Z}\left[\frac{Erf(Z)^2}{1-\left(\frac{\omega c(Z)}{\omega}\right)^2}\right].$$

As a result, the electrons in the plasma generated at the aforementioned plasma generating section A of FIG. 1 are axially accelerated to the plasma reaction section B so that an electrostatic field $Eo(Z)$ to accelerate ions is axially generated in that plasma. In other words, the plasma is accelerated as a whole in the axial direction so that an axial plasma flow is established in a plasma reaction bath 11.

Moreover, the diameter of the plasma flow at this time is determined by the diameter of the open end 8 of the plasma generating glass tube 3. Nevertheless, in case the distance to a substrate 10 placed to be treated upon a platform 9 arranged to face that open end 8 is long, the plasma flow to flow from the open end 8 into the bath 11 generally has a larger diameter than that of the open end 8 so that it has a diverged shape. This is because the lines of magnetic force of the magnetic field by the air-core coil 1 are divergent at that portion.

On the other hand, in case the substrate 10 placed on the aforementioned platform 9 so that it may be treated, for example, a silicon substrate is to be irradiated uniformly all over its surface with the plasma, it is necessary to suitably adjust the diameter of the plasma flow in that plasma reaction bath 11. For this necessity, there are disposed around the bath 11 static magnetic field generating coils 12 and 13 for correcting the shape of the plasma flow. These coils may be one or more than two, and the substrate 10 having a suitable size can have its surface irradiated uniformly with the plasma flow at a right angle by suitably adjusting the arrangement and position of the coils, the shape of the lines of magnetic force generated thereby, and the spacial distribution of the magnetic field. On the other hand, that plasma reaction bath 11 is formed with observation windows 14 and 15, through which both the state of the plasma flow and the surface condition of the substrate in the course of the treatment are to be observed. Moreover, evacuation of the gas is performed by way of outlet ports 17 of an evacuated bath 16. At the same time, the substrate platform 9 can be moved up and down and turned. Incidentally, numeral 18 indicates a shield for preventing the high-frequency waves from leaking out.

The plasma treating apparatus according to the embodiment thus far described with reference to FIG. 1 can be applied to a variety of surface treatments including the plasma etching, CVD (i.e., Chemical Vapor Growth) and oxidizing treatments and can effectively perform those treatments.

In the apparatus construction thus far described, another example for control means of the ion energy of the plasma flow will described in the following. For example, in case only the ions in the plasma flow are to be used, there are arranged in the aforementioned plasma reaction bath 11 at least one, e.g., two control grids 19 and 20 which are directed to intersect the plasma flow at a right angle, as in the embodiment shown in FIG. 3. Only the ions and radicals can be made to act upon the surface of the substrate 10 by impressing suitable potentials upon those grids 19 and 20. In this case, moreover, the magnitude and distribution of the operating energy can be arbitrarily changed by suitably combining the potentials and high-frequency powers to be applied to the grids 19 and 20, respectively, and the gas pressure.

In other words, those controls are effective to rearrange the energy of the ion $F^+$, which can contribute to the reactions, into a distribution having an excellent reaction efficiency, and are capable of always directing the incident ions at a right angle with respect to the substrate surface. Thus, the reactive ion etching treatment having an excellent directivity can be achieved.

Figure 4:
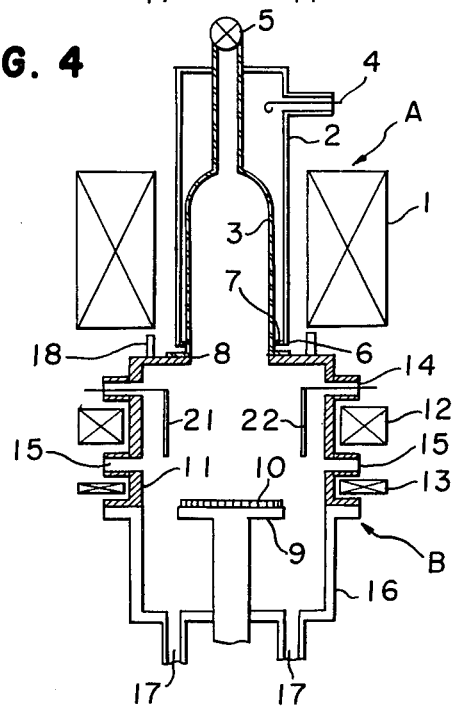

As in the embodiment shown in FIG. 4, still moreover, control grids 21 and 22 outside of and in parallel with the plasma flow are arranged in the form of a cylinder or slit. The contour of the plasma flow can be shaped by impressing suitable potentials upon those control grids 21 and 22. In addition, these grids 21 and 22 are enabled to play the roles of electron collectors when they are supplied with a potential having a suitable polarity, e.g., a negative polarity and a suitable level. This third embodiment is effective to enhance the uniformity in the reactions on the substrate surface, especially, at its circumference.

We claim:

1. A plasma treating apparatus comprising:
   an air-core coil for generating a static magnetic field which is axially uniform;
   a high-frequency waveguide for generating a high-frequency electromagnetic field which is irregular in the axial direction of said air-core coil;
   a plasma generating glass tube disposed in said high-frequency waveguide and adapted to be supplied with a gas whereby said electromagnetic field and said magnetic field cause an axial acceleration plasma flow in said tube;
   a plasma reaction bath held under a vacuum for receiving said plasma flow which is generated axially in said glass tube;
   a substrate platform disposed in said reaction bath for supporting a substrate to be treated at a right angle with respect to the plasma flow; and
   a magnetic field generating coil disposed outside of said reaction bath for shaping said plasma flow.

2. A plasma treating apparatus as set forth in claim 1, further comprising a plasma controlling grid disposed in said plasma reaction bath at one of a right angle and in parallel with respect to the plasma flow.

* * * * *